United States Patent [19]

Cuomo et al.

[11] Patent Number: 4,849,079
[45] Date of Patent: Jul. 18, 1989

[54] PROCESS FOR PREPARING LOW ELECTRICAL CONTACT RESISTANCE COMPOSITION

[75] Inventors: Jerome J. Cuomo, Lake Lincolndale; Eric P. Dibble, Endicott; Solomon L. Levine, Vestal, all of N.Y.

[73] Assignee: International Business Machines Corp., Endicott, N.Y.

[21] Appl. No.: 186,403

[22] Filed: Apr. 26, 1988

Related U.S. Application Data

[62] Division of Ser. No. 866,554, May 23, 1986, Pat. No. 4,774,151.

[51] Int. Cl.$^4$ .............................................. C23C 14/34
[52] U.S. Cl. ................................................. 204/192.17
[58] Field of Search ....................... 204/192.17, 192.15

[56] References Cited

U.S. PATENT DOCUMENTS

| | | | |
|---|---|---|---|
| 3,574,143 | 4/1971 | Vratny | 252/520 |
| 3,630,872 | 12/1971 | Reichelt | 204/192.17 |
| 4,419,202 | 12/1983 | Gibson | 204/192.16 |

FOREIGN PATENT DOCUMENTS 2077300 12/1981 United Kingdom ........... 204/192.15

Primary Examiner—Aaron Weisstuch
Attorney, Agent, or Firm—Pollock, Vande Sande & Priddy

[57] ABSTRACT

A composition of a metallic compound represented by the formula MT, and G is provided by sputtering an $M_xG_{100-x}$ target. M is a metal selected from the group of titanium, hafnium, zirconium, and mixtures thereof. T is selected from the group of N, C, and mixtures thereof. G is a metal selected from the group of gold, platinum, and palladium. X is an integer from about 65 to about 95. Also provided are substances coated with the composition and process for depositing the composition on substrates.

19 Claims, 1 Drawing Sheet

4,849,079

PROCESS FOR PREPARING LOW ELECTRICAL CONTACT RESISTANCE COMPOSITION

This is a divisional of application Ser. No. 866,554, filed on May 23, 1986, now U.S. Pat.No. 4,774,151.

DESCRIPTION

1. Technical Field

The present invention is concerned with certain compositions obtained by sputtering and particularly certain compositions that exhibit low electrical contact resistance.

In addition, the present invention is concerned with substrates coated with the sputtered compositions of the present invention. The present invention also provides a process for depositing compositions onto substrates. Articles of the present invention provide contact for electrical connectors.

2. Background Art

Electrical contacts and especially those designed for carrying relatively low currents such as in the order of milliamperes require extremely small voltage drops across the contact. This means that the resistance of the contact to the flow of electricity should be as close to zero as possible. This resistivity is referred to as the contact resistance.

Because of their relatively low contact resistance, contact surfaces of precious metals such as gold, platinum, and palladium are used to a great extent in electronic applications. Not only do surfaces from these precious metal exhibit extremely low contact resistance, but also such surfaces are resistant to oxidation and thereby retain their low resistance.

However, in view of the expense of such precious metals, attempts and suggestions of eliminating or at least reducing the amount of such materials have been made. Such prior suggestions have not been entirely satisfactory.

The problem becomes even more difficult when it is desired to provide a surface that not only exhibits relatively low electrical resistance, but also relatively high wear resistance, and resistance to oxidation.

SUMMARY OF INVENTION

In accordance with the present invention compositions are provided that exhibit low contact resistance and oxidation resistance while at the same time significantly reducing the amount of precious metal used. The compositions of the present invention make it possible to reduce the amount of precious metal employed while at the same time achieving acceptable contact resistance values.

In addition, the compositions of the present invention provide for good wear resistance.

The present invention is concerned with a composition of a metallic compound represented by the formula MT, and G. M represents a metal selected from the group of titanium, hafnium, zirconium, and mixtures thereof. T is selected from the group of N, C, and mixtures thereof. G represents a metal selected from the group of gold, platinum, and palladium.

The composition of the present invention is obtained by sputtering a target of $M_xG_{100-x}$. X is an integer from about 65 to about 95.

In addition, the present invention is concerned with a substrate coated with the above-defined composition.

Another aspect of the present invention is a process for depositing a layer containing a metallic compound represented by the formula MT, and G onto a substrate. MT, and G have the same meanings as presented hereinabove.

The process comprises providing a substrate; providing a target of $M_xG_{100-x}$ separate from the substrate. X is an integer from about 65 to about 95. The target is then subjected to reactive sputtering with a gas containing a source of N, C, or mixtures thereof. The gas flows in the direction towards the substrate to thereby deposit said layer on said substrate.

BEST AND VARIOUS MODES FOR CARRYING OUT INVENTION

Figure 1:
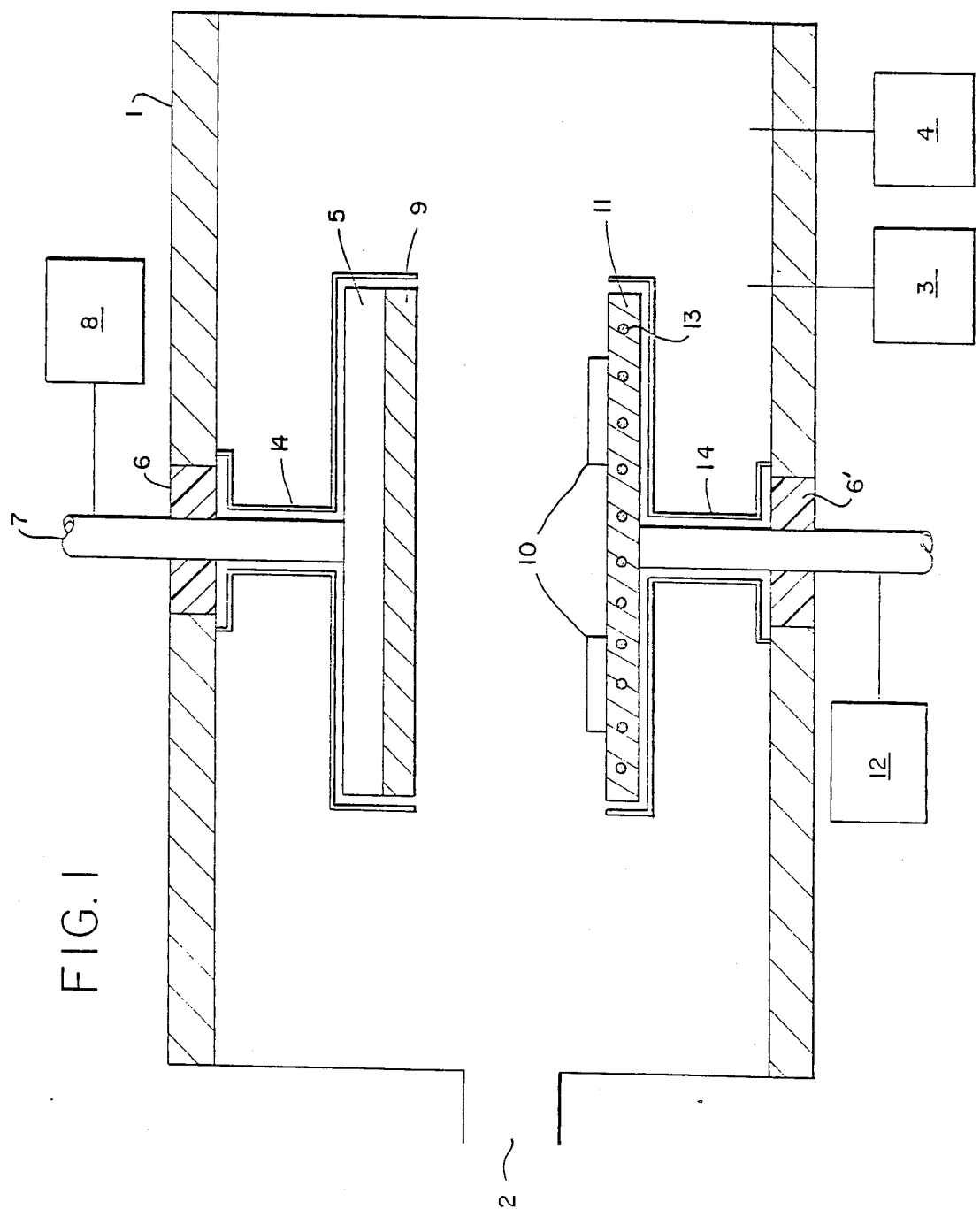
FIG. 1 is a schematic cross-sectional view of an apparatus suitable for carrying out the present invention.

Referring to FIG. 1, a schematic of a typical structure for practicing the present invention is shown. The vaccum chamber (1) is evacuated by the vacuum system (2) not shown in the Figure. Gas supplies (3) and (4) are used as the source for inert and active sputtering gas, respectively. The target support (5) is electrically isolated from chamber (1) by insulator (6) and is cooled by coolant supply (7) and is powered by the power supply (8). The $M_xG_{100-x}$ target (9) is fixed to the target support (5). The substrates (10) sit on electrode (11) which is isolated from chamber (1) by insulator (6) and is powered by the supply (12) which will act to supply voltage to the substate holder/electrode (11). A heater (13) is used to heat the substrates (10) during the process. Ground shields (14) confine the discharge between electrode plates (9) and (11) thus preventing power loss through these surfaces. The apparatus described in FIG. 1 and its operations are known in the art and can be practiced in DC, RF, or combinations of the two in order to produce these novel materials of the present invention. For instance, see Thin Film Processes, edited by John L. Vossen and Werner Kern, Chapter II-1, Academic Press, New York (1978), disclosure of which is incorporated herein by reference. The deposition of the composition containing the metallic compound represented by the formula MT, and G occurs on the substrate represented as 10.

The substrate (10) is made of a material which does not melt under the conditions of the process and includes silicon, polycrystalline silicon, sapphire, copper, and beryllium-copper.

In the operation of the process of the present invention the compositions are provided by employing a target of $M_xG_{100-x}$ wherein M is a metal selected from the group of titanium, hafnium, zirconium, and mixtures thereof; and G is a metal selected from the group of gold, platinum, and palladium. X is an integer from about 65 to about 95. Preferably X is about 70 to about 80 and most preferably about 75. Typical target materials employed are of zirconium-palladium; titanium-gold; zirconium-gold; hafnium-gold; and titanium-platinum.

Generally, the target materials are spaced about 4 to about 10 centimeters from the substrate (10).

The sputtering reaction forming the compositions of the present invention involves subjecting the target to a relatively high voltage such as at about 500 to about 4,000, typical of which is about 2,000 volts (measurement being each one-half peak to peak) and applying a bias voltage on the substrate of about 50 to about 300 volts, typical of which is about 100 volts. The temperature of the substrate is about 20° C. to about 500° C., preferably about 20° C. to about 300° C., typical of which is about 300° C.

In order to obtain reactive sputtering a glow discharge in the gas is generated such as by applying a RF discharge, a simple DC glow discharge, with DC or RF bias.

The gas employed is a mixture of an ionizable gas that is inert and a gas capable of reacting chemically with the metal M of the target to form a nitride, carbide, and/or carbonitride. The ionizable gas should be one which does not react chemically with the materials of the substrate and should preferably be readily ionizable and have a high atomic number so as to form ions with a relatively high momentum that is capable of ejecting metal atoms and ions from the target. The preferred ionizable gas is krypton; however, other inert gases such as argon can be used if desired. The other gas in the gas mixture is one which provides species reactive with the metal M of the target to provide a nitride, carbide, and/or carbonitride. The preferred reactive gas is nitrogen.

The gas mixture usually contains about 10% to about 85% by volume, and preferably about 10% to about 40% by volume of the reactive gas with the remainder being the ionizable inert gas.

The rate of deposition of the film onto the substrate is generally about 10 to about 10,000 angstroms per minute and preferably about 60 to about 1,000 angstroms per minute. Typical films are about 100 to about 10,000 angstroms thick and more usually about 5,000 to about 10,000 angstroms thick.

The film includes the gold, platinum, and/or palladium contained as particles within a matrix of the other metallic compound. Also, it is believed that the gold, platinum, and/or palladium are located in grain boundaries. It is also noted that the films will not necessarily contain the same ratio of the metal M to the gold, platinum, and/or palladium that was in the target since the ions from the plasma may extract one or the other metal from the film at an increased rate as compared to the other metal. However, the ratio of the metals contained in the film will be usually within about 50% of the ratio of the metals as present in the target.

In addition, the gold, platinum, and/or palladium are inert to reaction with the reactive gases. The reactive gases as discussed above, however, react with the metal M of the target material.

The following non-limiting examples are presented to further illustrate the present invention:

EXAMPLE 1

A target (9) of $Ti_{75}Au_{25}$ is introduced into an apparatus of the type illustrated in FIG. 1. The target voltage applied from supply (8) is about 2000 volts. The substrate (10) employed is a beryllium copper substrate containing about 1% to about 3% by weight of beryllium. The bias voltage on the substrate from power supply (12) is about 100 volts and the temperature of the substrate is maintained at about 300° C. during the process by heater (13). A gas mixture containing krypton introduced into the apparatus via gas supply (3) and nitrogen via gas supply (4) in a volume ratio of about 8 to 1. The pressure is about 30 millitorr at the start of the process. The discharge is achieved by employing radio frequency at about 13.56 megahertz. The rate of deposition of the film is about 100 angstroms per minute. The ratio of Ti to Au in the film is about 2.6:1. The film resistivity is about 49.8 micro-ohm/centimeters and the contact resistance as tested with a pure gold contact is about 25 milliohms. The contact resistance is measured by the 4-point probe method ASTM procedure number B667-80 for measuring low resistivities. A gold-plated loop is employed as the riding member and the sputter coatings are the flat coupon in the procedure.

EXAMPLE 2

Example 1 is repeated, except that the target is of $Zr_{75}Pd_{25}$. The film composition obtained is zirconium nitride along with palladium, wherein the ratio of the zirconium to palladium is about 4.69 to about 1. The film resistivity is about 159 micro ohms/centimeters.

Having thus described our invention, what we claim as new and desire to secure by Letters Patent is:

1. A process for depositing a layer containing particles of a metal G in a matrix of a metallic compound represented by the formula MT onto a substrate which comprises:
   providing a substrate;
   providing a target source of $M_xG_{100-x}$ separate from said substrate;
   subjecting said target source to reactive sputtering with a gas containing a source of N, C, or mixtures thereof and flowing in the direction towards the substrate to thereby deposit said layer on said substrate wherein;
   M is a metal selected from the group of titanium, hafnium, zirconium, and mixtures thereof;
   T is selected from the group of N, C, and mixtures thereof;
   G is a metal selected from the group of gold, platinum, and palladium;
   X is an integer from about 65 to about 95.

2. The process of claim 1 wherein said gas includes an inert ionizable gas.

3. The process of claim 2 wherein said inert ionizable gas includes krypton or argon.

4. The process of claim 2 wherein said inert ionizable gas includes krpton.

5. The process of claim 2 wherein said gas further includes nitrogen.

6. The process of claim 5 wherein said gas contains about 10% to about 85% by volume of nitrogen.

7. The process of claim 5 wherein said gas contains about 10% to about 40% by volume of nitrogen.

8. The process of claim 1 wherein said layer is about 100 to 10,000 angstroms thick.

9. The process of claim 1 wherein said layer is about 5,000 to 10,000 angstroms thick.

10. The process of claim 1 wherein said substrate is selected from the group of silicon, polycrystalline silicon, sapphire, copper, and beryllium-copper.

11. The process of claim 1 wherein said substrate is beryllium-copper.

12. The process of claim 1 wherein said target source is selected from the group of zirconium-palladium, titanium-gold, zirconium-gold, hafnium-gold, and titanium-platinum.

13. The process of claim 1 wherein said layer contains a nitride.

14. The process of claim 1 wherein said target source is titanium-gold.

15. The process of claim 1 wherein said target source is zirconium-palladium.

16. The process of claim 1 wherein said layer contains titanium-nitride and gold.

17. The process of claim 1 wherein said layer contains zirconium-nitride and palladium.

18. The process of claim 1 wherein x is about 70 to about 80.

19. The process of claim 1 wherein x is about 75.

* * * * *